United States Patent
Sullivan et al.

(10) Patent No.: US 12,354,674 B2
(45) Date of Patent: Jul. 8, 2025

(54) NON-VOLATILE MEMORY POWER CYCLE PROTECTION MECHANISM

(71) Applicant: Apple Inc., Cupertino, CA (US)

(72) Inventors: John J. Sullivan, Sunnyvale, CA (US); James M. Hollabaugh, San Jose, CA (US); Jason W. Brinsfield, San Francisco, CA (US); Calvin M. Ryan, Berkeley, CA (US); Andreas Adler, Schlierbach (DE)

(73) Assignee: Apple Inc., Cupertino, CA (US)

( * ) Notice: Subject to any disclaimer, the term of this patent is extended or adjusted under 35 U.S.C. 154(b) by 43 days.

(21) Appl. No.: 17/874,100

(22) Filed: Jul. 26, 2022

(65) Prior Publication Data

US 2024/0038310 A1 Feb. 1, 2024

(51) Int. Cl.
*G11C 16/30* (2006.01)
*G11C 16/10* (2006.01)
*G11C 16/14* (2006.01)
*G11C 16/32* (2006.01)

(52) U.S. Cl.
CPC ............ *G11C 16/30* (2013.01); *G11C 16/102* (2013.01); *G11C 16/14* (2013.01); *G11C 16/32* (2013.01)

(58) Field of Classification Search
CPC ....... G11C 16/30; G11C 16/102; G11C 16/14; G11C 16/32
See application file for complete search history.

(56) References Cited

U.S. PATENT DOCUMENTS

| 10,937,506 | B1* | 3/2021 | Patel | ............... G11C 16/10 |
| 11,119,556 | B2* | 9/2021 | Patel | ............... G06F 1/3296 |
| 2016/0070476 | A1 | 3/2016 | Cabrera | |
| 2017/0075831 | A1 | 3/2017 | Rajan | |
| 2019/0377396 | A1 | 12/2019 | Patel | |

OTHER PUBLICATIONS

International Preliminary Report on Patentability in PCT Appl. No. PCT/US2023/028195 mailed Feb. 6, 2025, 6 pages.

* cited by examiner

*Primary Examiner* — Vanthu T Nguyen
(74) *Attorney, Agent, or Firm* — Kowert, Hood, Munyon, Rankin & Goetzel, P.C.; Gareth M. Sampson; Dean M. Munyon

(57) ABSTRACT

Techniques for protecting non-volatile memory (NVM) from power cycle interruptions during memory operations are disclosed. A power management integrated circuit (PMIC) coupled to a memory circuit with NVM implements the various techniques disclosed. When a power reset signal is asserted to a PMIC, the PMIC may delay initiation of the power reset cycle when it detects that the NVM coupled to the PMIC is active to prevent corruption of the NVM by the power reset cycle. The PMIC may detect the activity level of the NVM based on an activity output signal that indicates whether the NVM is active (e.g., programming or erasing) or inactive.

20 Claims, 9 Drawing Sheets

800

```
┌─────────────────────────────────────────────┐
│ Receiving, at a power management circuit,   │
│ a power reset signal                        │
│ 802                                         │
└─────────────────────────────────────────────┘
                      │
                      ▼
┌─────────────────────────────────────────────┐
│ Receiving, at the power management circuit, │
│ a binary value indicating activity of a     │
│ memory circuit coupled to the power         │
│ management circuit, the memory circuit      │
│ including non-volatile flash memory         │
│ 804                                         │
└─────────────────────────────────────────────┘
                      │
                      ▼
┌─────────────────────────────────────────────┐
│ Determining, by the power management        │
│ circuit, whether to reset power to the      │
│ memory circuit based on the binary value    │
│ 806                                         │
└─────────────────────────────────────────────┘
```

FIG. 8

NON-VOLATILE MEMORY POWER CYCLE PROTECTION MECHANISM

BACKGROUND

Technical Field

Embodiments described herein relate to electronic circuits. More particularly, embodiments described herein relate to techniques for protecting non-volatile memory operations from power cycle interruptions.

Description of the Related Art

Non-volatile (e.g., flash) memory is increasingly being used in various types of electronic devices. For instance, flash memory is commonly used in handheld or small portable electronic devices. Additionally, memory storage capacity has greatly increased in these devices due to developments in flash memory. With the increase in usage of flash memory and the capacity of flash memory, there is an increasing need to prevent corruption of flash memory during various operations associated with the memory.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 8 is a flow diagram illustrating a method for managing power for a non-volatile memory circuit, according to some embodiments.

Figure 1:
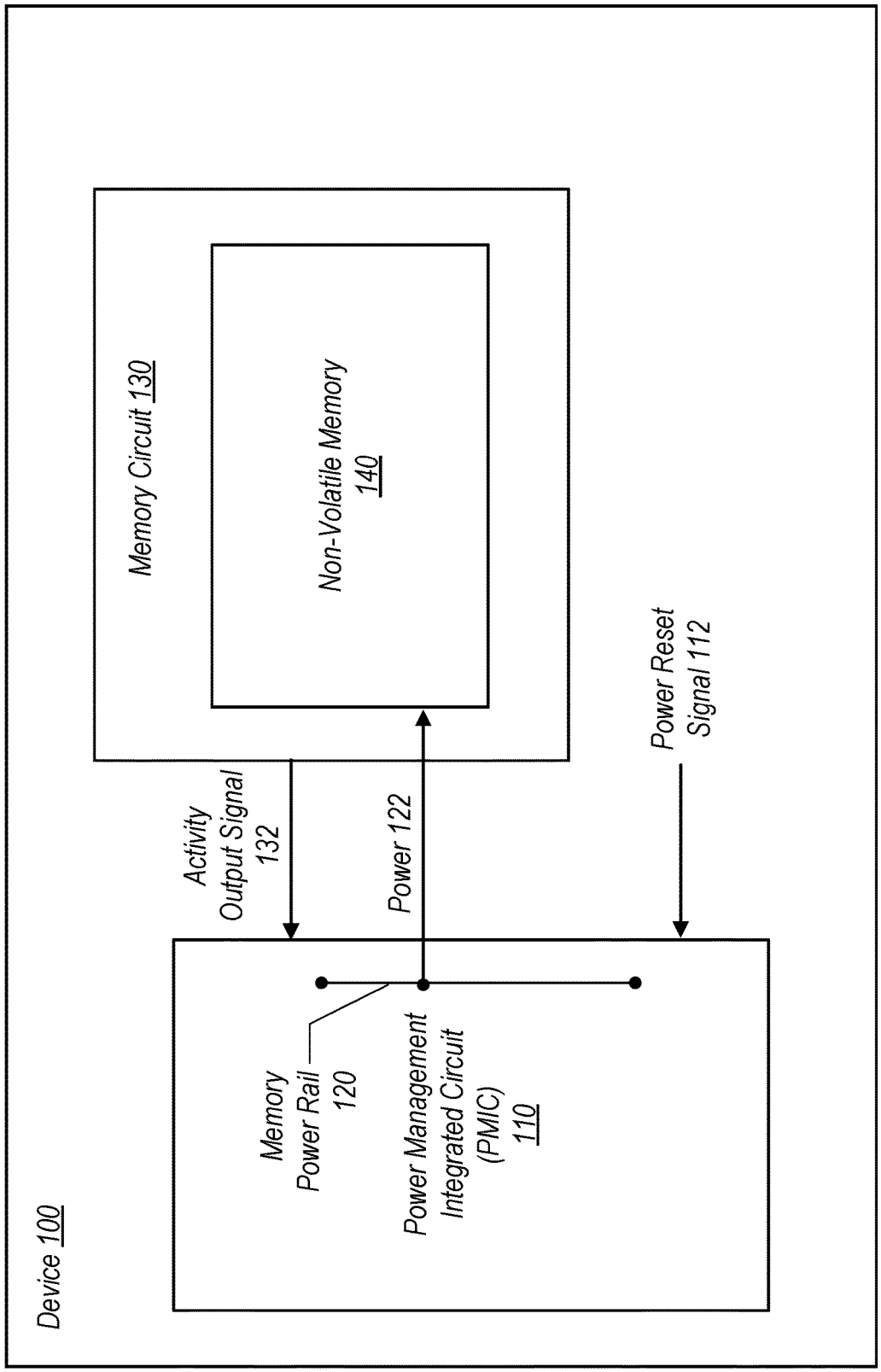
FIG. 1 depicts a block diagram of an integrated circuit (IC) device, according to some embodiments.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to techniques for protecting non-volatile memory (NVM) from power cycle interruptions during memory operations. Certain NVM circuits (such as NOR flash memory circuits) are sensitive to power cycling when in the middle of operations. For instance, during programming or erase memory operations, any interruption of the operation with a power cycle (e.g., a power reset) may lead to catastrophic data corruption in the NVM.

To mitigate these issues with NVM, the present disclosure contemplates the implementation of an activity output signal associated with the NVM circuit to indicate an activity level of the NVM circuit. The activity output signal may indicate whether the NVM circuit is active (e.g., conducting programming or erasing memory operations) or inactive (e.g., idle). In various embodiments, the activity output signal may be a binary value indicating the NVM circuit is active or inactive. For example, the activity output signal may be a "Ready/Busy" signal where "Ready" indicates the NVM circuit is inactive and "Busy" indicates the NVM circuit is active.

In some embodiments, the activity output signal is provided as a dedicated output from the NVM circuit. For instance, the activity output signal may be determined by a readable active/inactive bit within the NVM circuit. In some embodiments, the activity output signal is provided from a memory controller circuit that controls memory operations (e.g., program or erase operations) of the NVM circuit. For instance, the memory controller circuit may be coupled to the NVM circuit through a serial programming interface (SPI) and determine the activity output signal based on its knowledge of the active/inactive status of the NVM circuit.

In various embodiments, the activity output signal is provided to a power management integrated circuit (PMIC). The PMIC may check the activity output signal when it receives a power reset signal or a power down sequence is initiated by the PMIC. The PMIC checks the activity output signal to determine whether the NVM circuit (or a group of NVM circuits) that would be affected by the power reset are active or inactive. In certain embodiments, the PMIC will not reset the power when the NVM circuit is indicated as being active by the activity output signal. In some embodiments, the PMIC will wait until the activity output signal changes to indicate the NVM circuit is inactive before proceeding with the power reset. In some embodiments, the PMIC may implement a timeout period (e.g., a predetermined time period) after which the power is reset for the NVM circuit regardless of activity status. The timeout period may be implemented to prevent system lock up in the event the activity output signal is stuck with an "active" status.

FIG. 1 depicts a block diagram of an integrated circuit (IC) device, according to some embodiments. In the illustrated embodiment, device 100 includes power management integrated circuit (PMIC) 110 with memory power rail 120 and memory circuit 130 with non-volatile memory (NVM) 140. In certain embodiments, power rail 120 is located in PMIC 110. In some embodiments, power rail 120 may be located external to PMIC 110. For instance, power rail 120 may be located in or near memory circuit 130.

In certain embodiments, memory circuit 130 includes non-volatile memory (NVM) 140. Embodiments contemplated herein are generally implemented for instances of NVM 140 being NOR flash memory though other non-volatile memories such as NAND flash memory may also be contemplated. Memory circuit 130 may include additional components in addition to NVM 140 to implement memory operations. For simplicity in the drawings and understanding of the present disclosure, only NVM 140 is shown in the representation of memory circuit 130 disclosed herein. In various embodiments, device 100 includes multiple integrated circuits that together form the device. For example, both PMIC 110 and NVM 140 may be separate integrated circuits that together operate as device 100. In some embodiments, the multiple integrated circuits may be located on a single chip (e.g., a system-on-chip (SOC)).

Power 122 for NVM 140 is provided by power rail 120 in PMIC 110. PMIC 110 provides control over power to NVM 140 by regulating power on power rail 120. For example, PMIC 110 may turn on/off power rail 120 to turn on/off power to NVM 140. In various embodiments, PMIC 110 turns off or resets (e.g., cycles) power to NVM 140 based on an external input. For instance, in the illustrated embodiment, PMIC 110 may receive power reset signal 112 and, in response to the power reset signal, reset/cycle the power to NVM 140 by turning off power rail 120 for a predetermined time and then back on. Power reset signal 112 may be received, for example, from a sensor (such as a temperature sensor), a central processor unit, or another component outside of device 100. In certain embodiments, power reset signal 112 is a binary value indicating whether to reset the power (e.g., a value of 0 to reset power and a value of 1 to not reset power). In various embodiments, power reset signal 112 is asserted to PMIC 110 to cycle the NVM in response to power cycling other components that are powered by the PMIC or when it is desired to place memory circuit 130 in a known good state. In some embodiments, power reset signal 112 is asserted to PMIC 110 to cycle the NVM for power usage reduction and/or to prevent heat damage to the NVM.

In various embodiments, PMIC 110 determines whether to begin a power reset (e.g., power cycle) on power rail 120 and NVM 140 based on activity output signal 132 received from memory circuit 130. In the illustrated embodiment, activity output signal 132 is a dedicated output from memory circuit 130 that indicates whether NVM 140 is active or inactive. As described herein, NVM 140 is active when the NVM is performing memory operations such as programming operations or erasing operations and the NVM is inactive (e.g., idle) when no memory operations are being performed.

In certain embodiments, activity output signal 132 is a binary value that indicates whether NVM 140 is active or inactive. For example, activity output signal 132 may be determined by a readable active/inactive bit within memory circuit 130 that assesses the activity of NVM 140 and outputs a binary value corresponding to the assessed activity. In some contemplated embodiments, activity output signal 132 may have a value of 0 (low) when NVM 140 is active ("Busy") or a value of 1 (high) when the NVM is inactive ("Ready"). In such embodiments, the readable active/inactive bit within memory circuit 130 may produce the appropriate binary value based on the activity of NVM 140.

As described above, when activity output signal 132 indicates NVM 140 is active, cycling the power to the NVM (e.g., going through a power reset cycle) may cause catastrophic data corruption in the NVM. Accordingly, in certain embodiments, PMIC 110 may check the current value of activity output signal 132 (e.g., the binary value) when power reset signal 112 is asserted before beginning the power reset (e.g., before shutting down power to power rail 120 and NVM 140). When PMIC 110 determines that NVM 140 is active based on the value of activity output signal 132, the PMIC may delay the shutting down of power to NVM 140 (via power rail 120) to prevent potential data corruption in the NVM. Correspondingly, when PMIC 110 determines that NVM 140 is inactive based on the value of activity output signal 132, the PMIC begins shutting down power to NVM 140 for the power reset process as a normal course of action in response to the assertion of power reset signal 112 to the PMIC.

In some embodiments, PMIC 110 delays starting the power reset (e.g., shutting down power) for NVM 140 until activity output signal 132 changes to indicate the NVM is inactive (e.g., the binary value changes from 0 to 1). In some embodiments, PMIC 110 may implement a predetermined time period (e.g., a "timeout") that once elapsed, the PMIC will begin the shutdown of power regardless of the state of activity output signal 132. The predetermined time period may be implemented to avoid system lock up in device 100 in the event activity output signal 132 is stuck indicating an "active" status. In some embodiments, PMIC 110 implements the predetermined time period by initiating a clock timer when power reset signal 112 is received and activity output signal 132 indicates NVM 140 is active. When the clock timer reaches the end of the predetermined time period (e.g., the time elapsed equals the preset timeout period), PMIC 110 will begin the power reset process.

Figure 2:
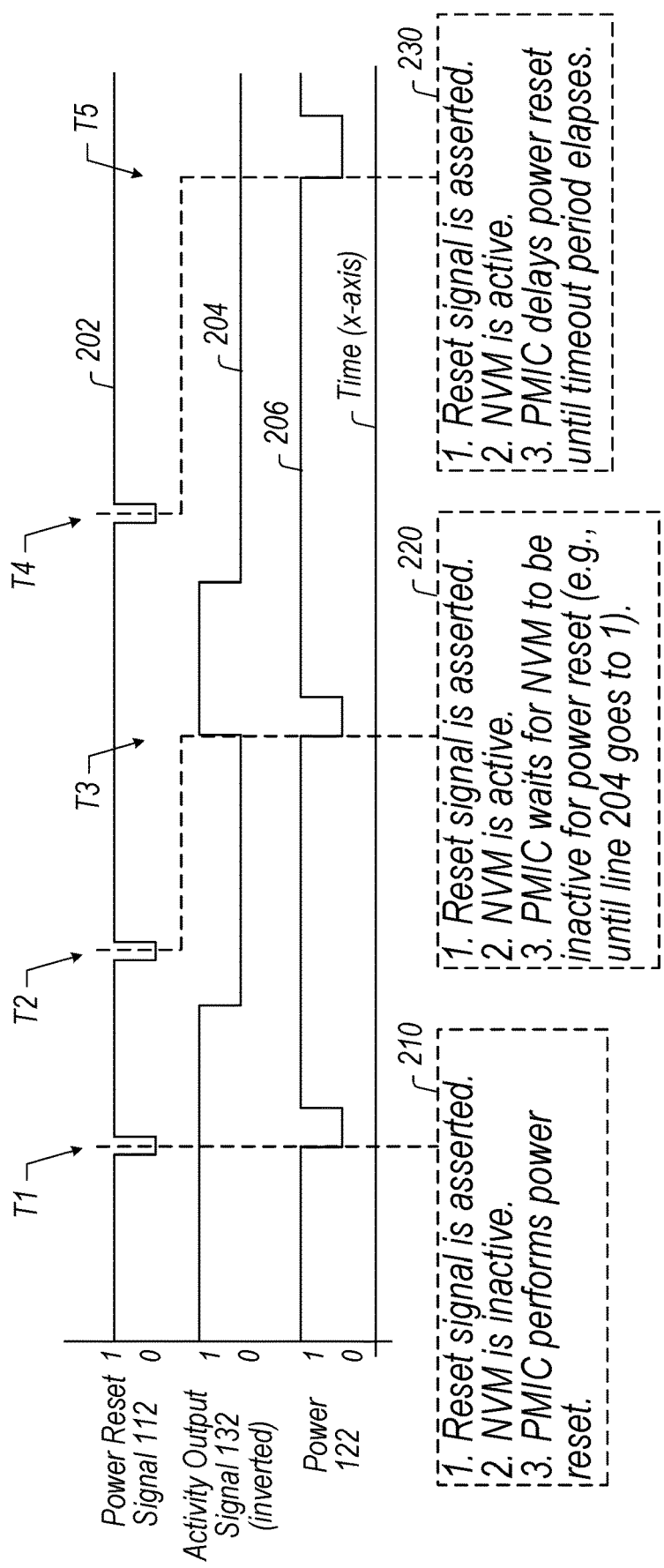
FIG. 2 depicts a signal timeline representation of various operations of a power management integrated circuit in controlling power reset to non-volatile memory, according to some embodiments.

FIG. 2 depicts a signal timeline representation of various operations of PMIC 110 in controlling power reset to NVM 140, according to some embodiments. Three signal lines associated with PMIC 110 are shown in the illustration of FIG. 2 with time along the x-axis. The top signal line (line 202) is power reset signal 112, which is shown as a binary value of 0 (power reset) or 1 (continue power state or constant power) on the y-axis. The middle signal line (line 204) is activity output signal 132, which is shown as a binary value of 0 (NVM 140 is active) or 1 (NVM 140 is inactive) on the y-axis. The bottom signal line (line 206) is a signal line representing whether power 122 to NVM 140 is turned on or off. The signal line corresponds to an output of PMIC 110 to power rail 120 determining whether power is shut off (binary value of 0 for no voltage) or power is turned on (binary value of 1 for full voltage) on the y-axis. It should be noted that actual power may turn on/off more slowly than shown by line 206 (e.g., there is some transition slope in voltage when powering on/off).

FIG. 2 illustrates three embodiments of operation (operation 210, operation 220, and operation 230) of PMIC 110 where the power 122 is determined to be turned on/off in response to assessment of both power reset signal 112 and activity output signal 132. Operation 210 describes the embodiment for operation of PMIC 110 when NVM 140 is inactive (e.g., when activity output signal 132 indicates the NVM is inactive). In the illustrated embodiment of operation 210, in (1) power reset signal 112 is asserted with a value of 0 at time, T1. In response to power reset signal 112 being received, PMIC 110 checks activity output signal 132, which has a value of 1 indicating NVM 140 is inactive in (2). PMIC 110 then performs the power reset in (3), as shown by the value of power 122 (line 206) shifting to 0.

Operation 220 describes the embodiment for operation of PMIC 110 when NVM 140 is active (e.g., when activity output signal 132 indicates the NVM is active) and the PMIC waits for the NVM to be inactive before beginning the power reset. In the illustrated embodiment of operation 220, in (1) power reset signal 112 is asserted with a value of 0 at time, T2. In response to power reset signal 112 being received, PMIC 110 checks activity output signal 132, which has a value of 0 indicating NVM 140 is active in (2). In (3), PMIC 110 then waits for activity output signal 132 (line 204) to change to a value of 1 (indicating NVM 140 is inactive) at time, T3, at which point the PMIC begins the power reset process.

Operation 230 describes the embodiment for operation of PMIC 110 when NVM 140 is active (e.g., when activity output signal 132 indicates the NVM is active) and the PMIC waits for the predetermined time period (e.g., the timeout period) to elapse before beginning the power reset. In the illustrated embodiment of operation 230, in (1) power reset signal 112 is asserted with a value of 0 at time, T4. In response to power reset signal 112 being received, PMIC 110 checks activity output signal 132, which has a value of 0 indicating NVM 140 is active in (2). In (3), PMIC 110 then delays the power reset until time, T5, which is when the timeout period elapses while activity output signal remains at the value of 0.

It should be understood that the timeout period (the embodiment of operation 230) may be implemented by PMIC 110 in combination with the embodiment of operation 220. For example, if activity output signal 132 changes to indicate NVM 140 is inactive (e.g., changes to a value of 1) before the timeout period elapses, PMIC 110 may begin the power reset process in response to the change in activity rather than waiting for the timeout period to elapse.

Figure 4:
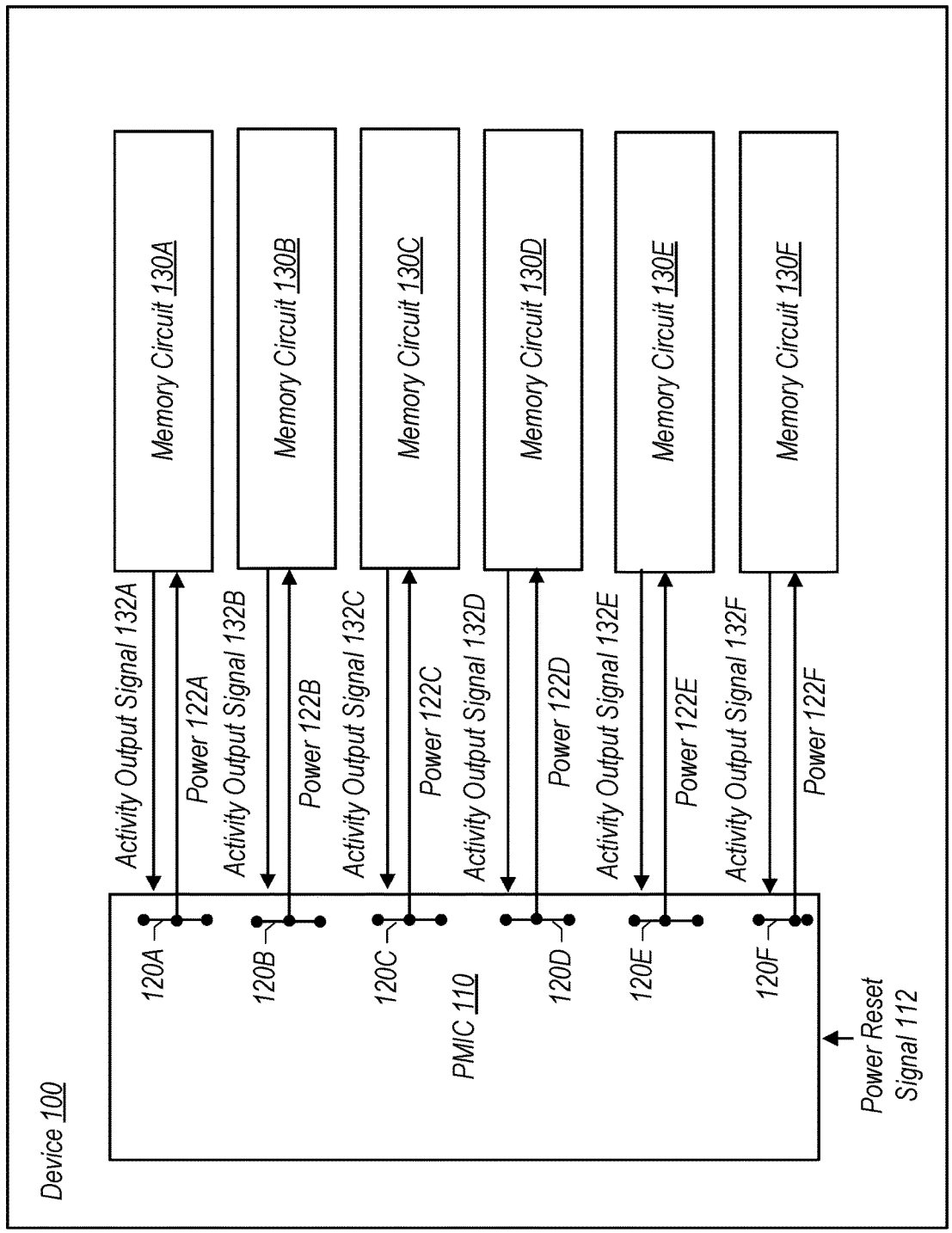
FIG. 4 depicts a block diagram of an integrated circuit (IC) device with multiple memory circuits, according to some embodiments.

In certain embodiments, as shown in FIG. 1, activity output signal 132 is provided from a dedicated output of memory circuit 130 (e.g., a dedicated output from a bit in the memory circuit). Various additional embodiments may be contemplated, however, where activity output signal 132 is output from a different component associated with memory circuit 130 or a group of memory circuits, as described below. PMIC 110 may operate power rail 120 agnostic of the origin of activity output signal 132. Thus, PMIC may operate power rail 120 (or multiple power rails 120, as shown in FIG. 4) in accordance with the embodiments depicted in FIG. 2 regardless of the origin of activity output signal 132.

Figure 3:
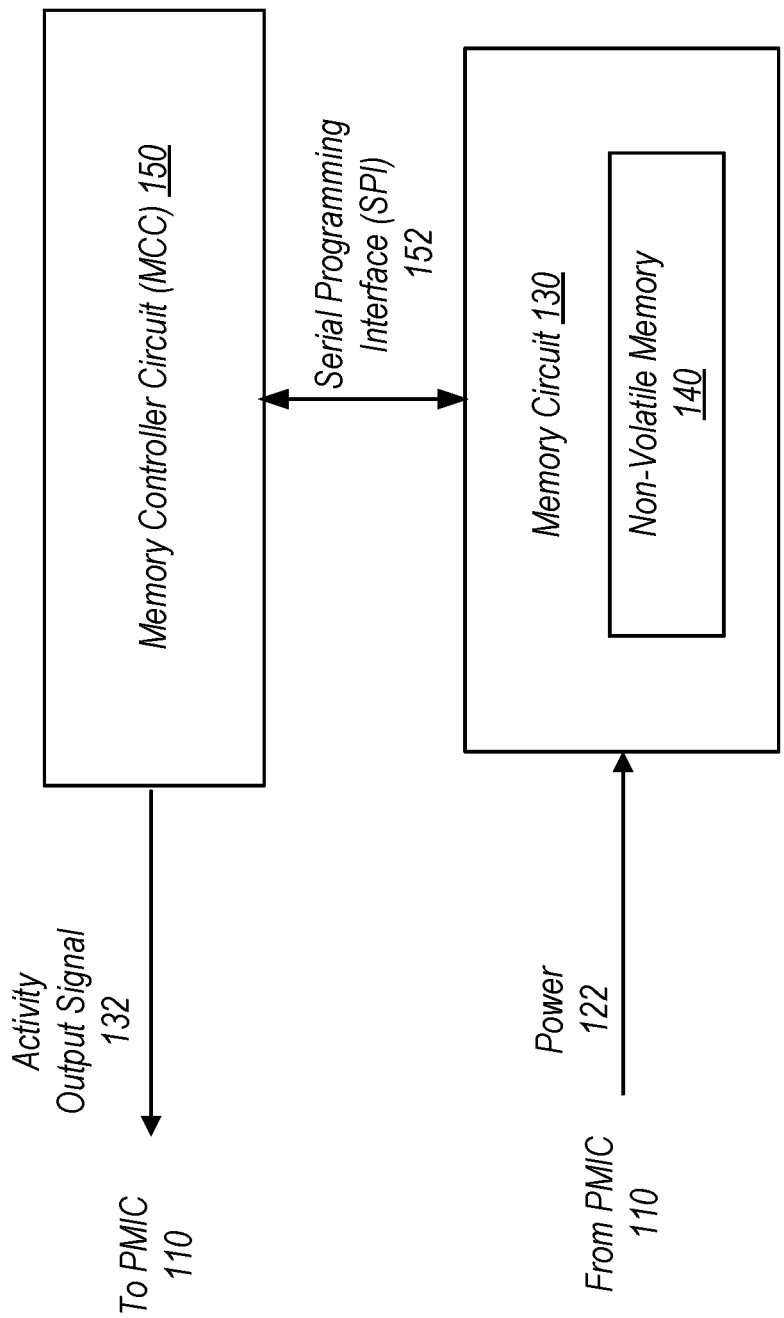
FIG. 3 depicts a block diagram of a memory circuit and a memory controller circuit (MCC), according to some embodiments.

FIG. 3 depicts a block diagram of a memory circuit and a memory controller circuit (MCC), according to some embodiments. In the illustrated embodiment, MCC 150 is coupled to memory circuit 130 via serial programming interface (SPI) 152. MCC 150 may control various memory operations (e.g., program or erase operations) of NVM 140 in memory circuit 130 via SPI 152. In some embodiments, MCC 150 may assess operating properties of memory circuit 130 and NVM 140 via SPI 152. While MCC 150 is depicted as being external to memory circuit 130 in the illustrated embodiments, additional embodiments may be contemplated where MCC 150 is located inside the memory circuit.

In various embodiments, MCC 150 outputs activity output signal 132 to PMIC 110. MCC 150 may determine a value of activity output signal 132 based on its knowledge of the active/inactive status of NVM 140 in memory circuit 130. For example, since MCC 150 controls the memory operations of NVM 140, MCC 150 may know the status of NVM 140 based on a control signal being determined in the MCC and sent to NVM 140. Accordingly, MCC 150 may determine the value of activity output signal 132 based on the value of the control signal being sent to NVM 140. In some embodiments, activity output signal 132 may be derived directly from the control signal. For instance, activity output signal 132 may be a duplication of the control signal that is output to PMIC 110.

Figure 5:
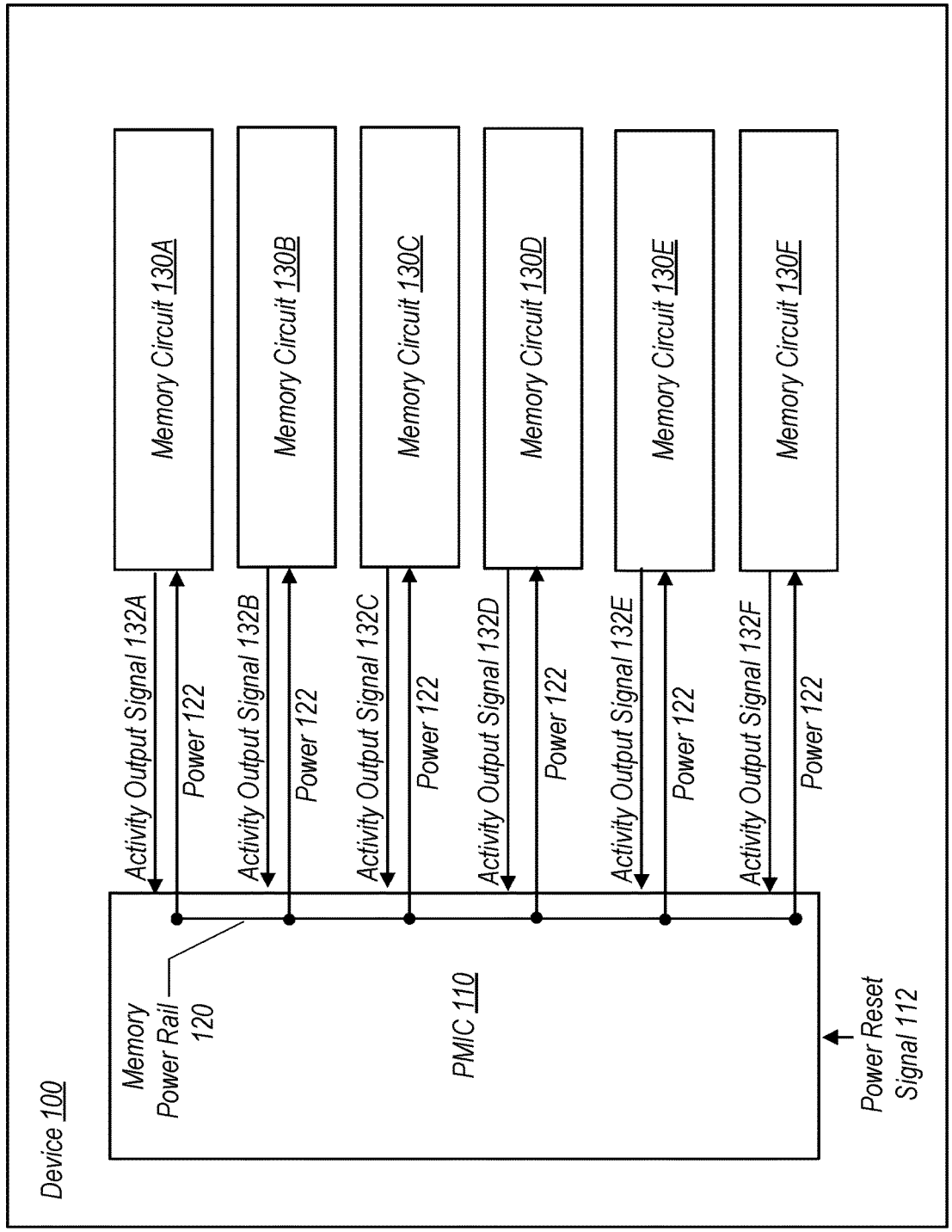
FIG. 5 depicts a block diagram of an integrated circuit (IC) device with multiple memory circuits coupled to a single power rail, according to some embodiments.
Figure 6:
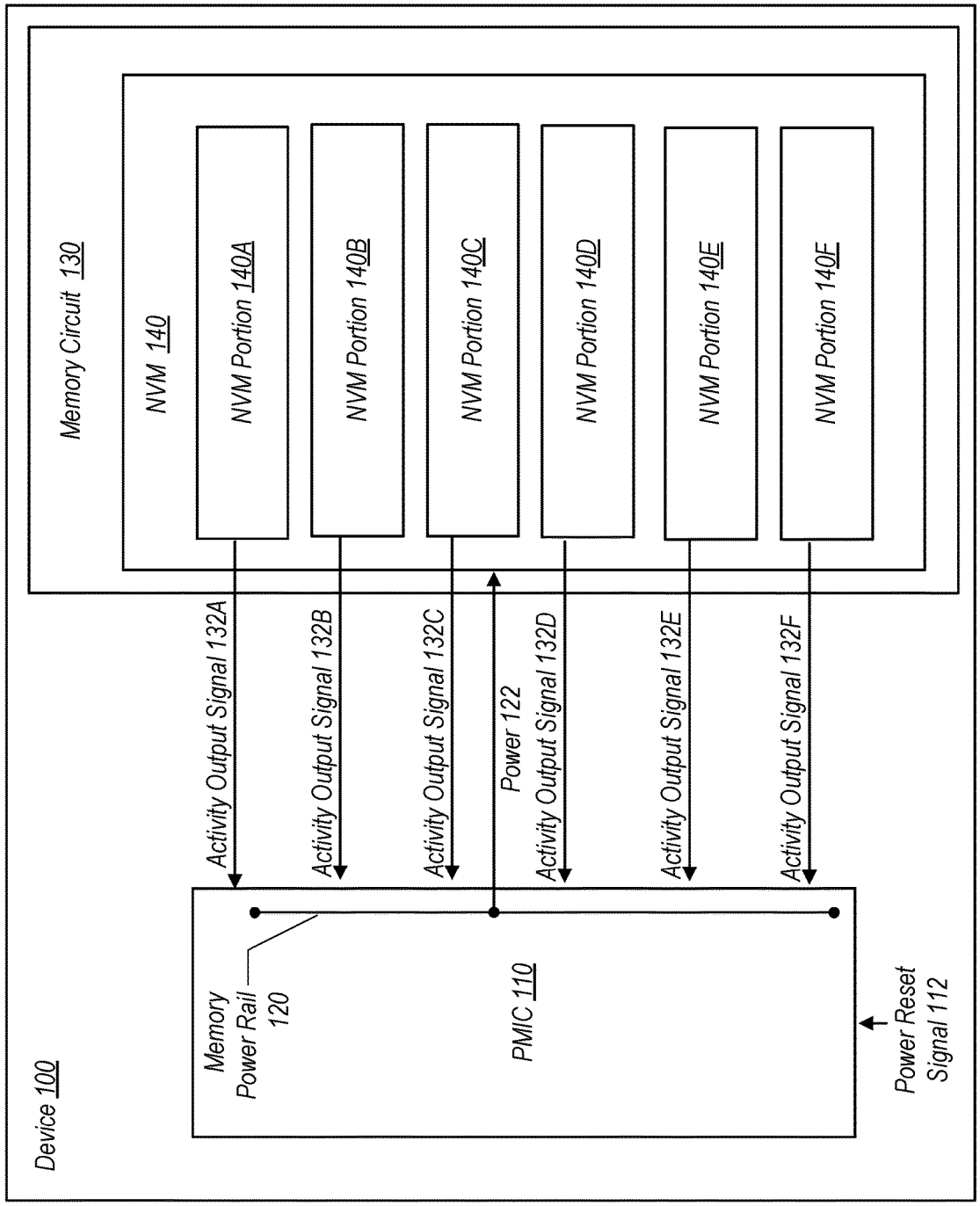
FIG. 6 depicts a block diagram of an NVM with multiple memory portions, according to some embodiments.

In many implementations of integrated circuit devices, PMIC 110 provides power management over multiple memory circuits instead of a single memory circuit. Various embodiments for power management of multiple memory circuits are contemplated herein. In FIGS. 4-6, the number of memory circuits shown is by way of example and the disclosure is not limited to any particular number.

FIG. 4 depicts a block diagram of an integrated circuit (IC) device with multiple memory circuits, according to some embodiments. Device 100 includes PMIC 110 coupled to a group of memory circuits (memory circuits 130A-130F). In the illustrated embodiment, the power rail is divided into power rail segments 120A-F to provide independent (e.g., individual) control of the power to memory circuits 130A-F. Each individual power rail segment 120A-F corresponds to and provides power for one individual memory circuit 130A-F. For example, power rail segment 120A provides power to memory circuit 130A, power rail segment 120B provides power to memory circuit 130B, etc.

As each memory circuit 130A-F has its own individually designated power rail segment 120A-F, respectively, the power to each memory circuit is provided individually. For example, each power rail segment 120A-F provides independent power 122A-F. Accordingly, each memory circuit 130A-F may have its power turned on/off without affecting another memory circuit.

Since power for each memory circuit 130A-F is individually controlled, each individual memory circuit may have its power controlled according to its own activity as indicated by its own activity output signal (e.g., output signals 132A-132F). For instance, power for memory circuit 130A coming from power rail segment 120A may be controlled based on activity output signal 132A for memory circuit 130A while power for memory circuit 130B coming from power rail segment 120B may be controlled based on activity output signal 132B for memory circuit 130B. Thus, the power reset process for each individual memory circuit 130A-F is controlled by PMIC 110 agnostically of the other memory circuits in device 100. For example, if memory circuit 130A is active, its status does not affect the power reset process for memory circuit 130B (with its status affecting its own power reset process as determined by PMIC 110).

In some embodiments, multiple memory circuits are coupled to a single power rail and power is controlled to the memory circuits as a group. FIG. 5 depicts a block diagram of an integrated circuit (IC) device with multiple memory circuits coupled to a single power rail, according to some embodiments. In the illustrated embodiment, power rail 120 is a single power rail that provides the same power (e.g., power 122) to each memory circuit 130A-F (e.g., a group of memory circuits).

Since the power for all memory circuits 130A-F in the group of memory circuits is controlled by a single power rail, a power reset implemented by PMIC 110 on power rail 120 will affect all the memory circuits. Accordingly, PMIC 110 determines whether to initiate the power reset process when power reset signal 112 is received in the PMIC based on activity status indicated by each of the activity output signals 132A-132F. As an example, when power reset signal 112 is received in PMIC 110, the PMIC may check each of the activity output signals 132A-F and delay power reset if any one of the activity output signals indicates activity of its corresponding memory circuit 130A-F. As further example, when power reset signal 112 is received in PMIC 110, if the PMIC determines that activity output signal 132C indicates memory circuit 130C is active then the PMIC will initiate one of the delay operations (e.g., operation 220 or operation 230) for power rail 120. As power rail 120 provides power 122 to all the memory circuits 130A-F, the power reset process is delayed for all the memory circuits.

In some embodiments, activity output signals 132A-132F are received independently by PMIC 110 (e.g., each activity output signal is received as a separate input by the PMIC). In some embodiments, activity output signals 132A-132F may be received as a single input by PMIC 110. For instance, activity output signals 132A-132F may be combined by an "or" function outside PMIC 110 and then a single input indicating that one of the activity output signals is active is received by the PMIC.

Various procedures for PMIC 110 beginning the power reset process after activity is detected in one of memory circuits 130A-F may be contemplated. For instance, in some embodiments, PMIC 110 may wait until all activity output signals 132A-F indicate inactivity. In such embodiments, it may be possible that the delay will be extended if one memory circuit goes active before another memory circuit goes inactive (e.g., if memory circuit 130D goes active before memory circuit 130C goes inactive). In some embodiments, PMIC 110 may begin the power reset process as soon as the memory circuit (or memory circuits) initially indicated as being active becomes inactive (e.g., once memory circuit 130C goes inactive in the example above).

In some embodiments, PMIC 110 may wait for a timeout period to elapse before beginning the power reset process. For instance, PMIC 110 may initiate the timeout period clock when it checks and finds that one or more memory circuits 130A-F are active in response to having power reset signal 112 received in the PMIC. In various embodiments, PMIC 110 may implement a signal or other control process that inhibits other memory circuits from going active while waiting for the active memory circuit to go inactive or waiting for the time period to elapse. For instance, PMIC 110 may power down MCC 150 before checking activity output signals and making a determination of memory circuit activity. Such a signal may prevent other memory circuits from going active and being corrupted when the power reset process proceeds.

Additional embodiments may be contemplated where NVM 140 includes multiple memory portions (e.g., different areas of memory in the NVM). These memory portions may have individual activity output signals that may be handled similarly to the embodiment of multiple memory circuits depicted in FIG. 5. FIG. 6 depicts a block diagram of NVM 140 with multiple memory portions, according to some embodiments. In the illustrated embodiment NVM 140 includes multiple NVM portions 140A-F. PMIC 110 provides a single power output to NVM 140 that provides power to all NVM portions 140A-F.

In certain embodiments, PMIC 110 receives activity output signals 132A-F individually from NVM portions 140A-F. PMIC 110 may then control whether to delay a power reset in response to power reset signal 112 based on activity levels of one or more of NVM portions 140A-F. For instance, PMIC 110 may determine whether to initiate the power reset process when power reset signal 112 is received in the PMIC based on activity status indicated by activity output signals from a subset of NVM portions. Accordingly, PMIC 110 may delay a power reset when only the subset of NVM portions are active and the activity of NVM portions outside the subset have no effect on the power reset process.

As an example, PMIC 110 may determine whether to initiate the power reset based on a subset of NVM portions that includes NVM portion 140A, NVM portion 140B, and NVM portion 140C. Thus, when power reset signal 112 is received in PMIC 110, PMIC 110 may check the activity status of NVM portions 140A-C based on activity output signals 132A-C. In some embodiments, activity output signals 132A-132C are received independently by PMIC 110 (e.g., each activity output signal is received as a separate input by the PMIC). In some embodiments, activity output signals 132A-132C are received as a single input by PMIC 110 (e.g., activity output signals 132A-132C may be combined by an "or" function outside PMIC 110). PMIC 110 may then make a determination of whether to begin or delay the power reset process based on the activity of NVM portions 140A-C indicated by activity output signals 132A-C, as described herein. For example, PMIC 110 may delay the power reset if any one of NVM portions 140A-C is active or may begin the power reset process if NVM portions 140A-C are all inactive. Accordingly, the power reset process is delayed only based on activity of NVM portions 140A-C and NVM portions 140D-F have no effect on the power reset process.

Figure 7:
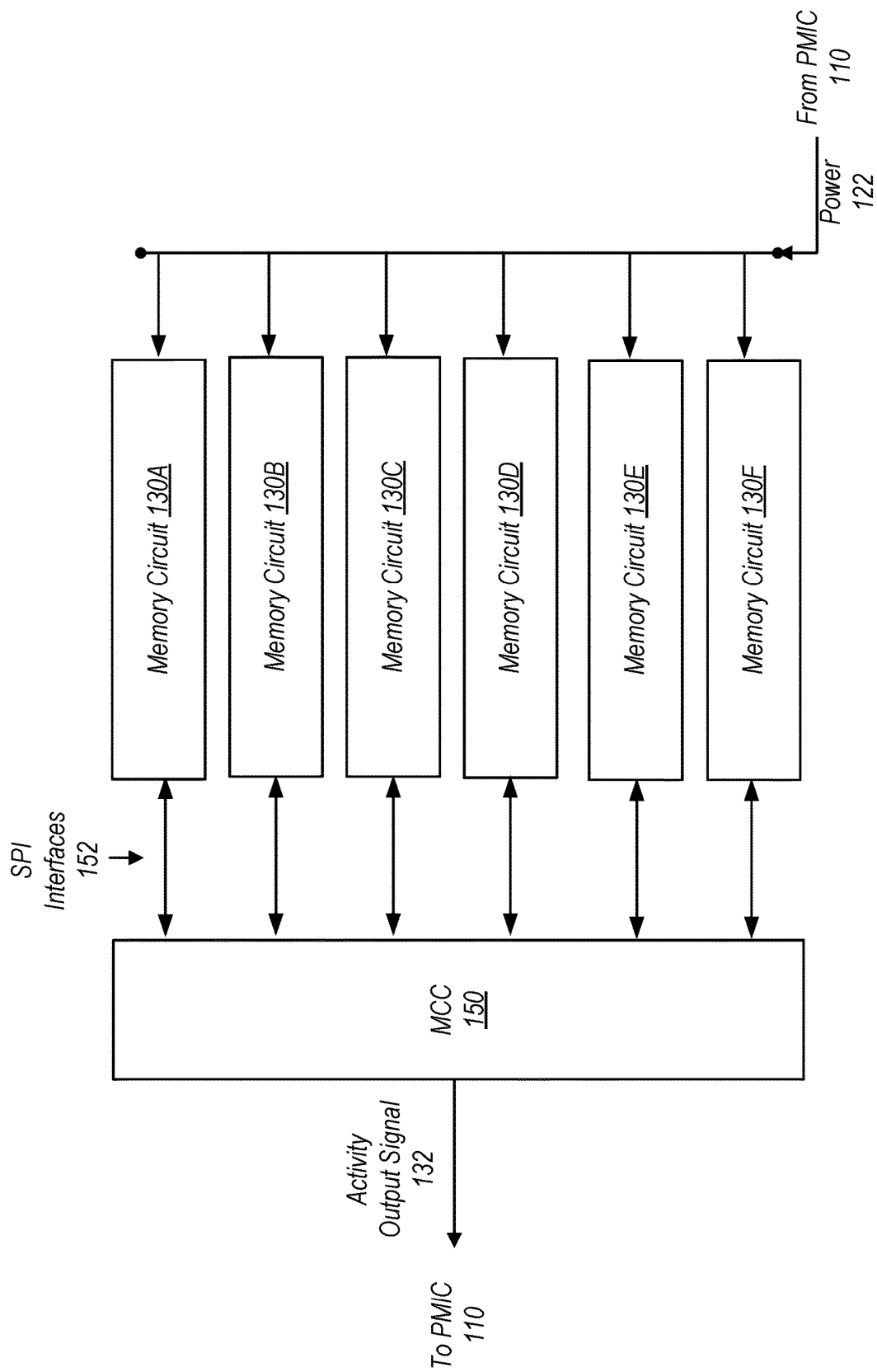
FIG. 7 depicts a block diagram of a memory controller circuit (MCC) coupled to a group of memory circuits, according to some embodiments.

In some embodiments, a memory circuit controller (e.g., memory circuit controller 150) is coupled to a group of memory circuits. FIG. 7 depicts a block diagram of a memory controller circuit (MCC) coupled to a group of memory circuits, according to some embodiments. In the illustrated embodiment, MCC 150 is coupled to memory circuits 130A-F via serial programming interfaces (SPIs) 152. As described herein, MCC 150 may control various memory operations (e.g., program or erase operations) of NVM 140 in memory circuits 130 via SPIs 152. It should be noted that NVMs 140 are not depicted in FIG. 7 for simplicity in the illustration.

In various embodiments, MCC 150 assesses operating properties of memory circuits 130A-F via SPIs 152 and outputs a single activity output signal (e.g., activity output signal 132) to PMIC 110. Accordingly, activity output signal 132 may indicate activity if any one of memory circuits 130A-F is active. For example, activity output signal 132 may be a value indicating active (the binary value of 0) when any one of the six memory circuits 130A-F is active as determined by MCC 150. Thus, activity output signal 132 may have a value of 1 (indicating inactivity) only if all the memory circuits controlled by MCC 150 (e.g., memory circuits 130A-F) are inactive. As described above, MCC 150 may determine activity/inactivity of memory circuits 130A-F based on knowledge from its control of the memory circuits.

In some embodiments, MCC 150 may provide an inactivity signal and expedite a power reset to the memory circuits when not all the memory circuits controlled by MCC 150 (e.g., memory circuits 130A-F) are inactive. For example, MCC 150 could determine that a subset of memory circuits 130A-F are critical data memory circuits (such as memory circuits 130A and 130B) while the remaining memory circuits are not responsible for critical data. Accordingly, MCC 150 may delay a power reset (e.g., provide active signal of binary value 0) when either memory circuit 130A or memory circuit 130B is active while ignoring the activity of the remaining (less critical) memory circuits.

In the illustrated embodiment of FIG. 7, activity output signal 132 is a single value provided to PMIC 110. PMIC 110 may control power 122 to memory circuits 130A-F as a group of memory circuits (similar to the embodiment of device depicted in FIG. 5). Thus, when power reset signal 112 is received in PMIC 110, the PMIC may control the power reset process, as described herein, for all memory circuits 130A-F based on activity output signal 132 received from MCC 150.

Described herein are various embodiments for a power management integrated circuit (PMIC) to control a power reset process for memory circuits with non-volatile memory (NVM) when a power reset signal is received in the PMIC. The PMIC (e.g., PMIC 110) implements the various embodiments to protect NVMs from having their power shut off while active (e.g., while programming or erasing). Preventing power being shut off to NVMs while they are active can help prevent catastrophic data corruption in the NVMs due to power cycling. While the embodiments disclosed herein implement a PMIC in the control of power reset operations, additional embodiments may be contemplated where another component responsible for power management of NVMs in an integrated circuit device may implement control over a power reset process without deviating from the scope of the disclosed embodiments.

Example Method

FIG. 8 is a flow diagram illustrating a method for managing power for a non-volatile memory circuit, according to some embodiments. Method 800 may be implemented using any of the embodiments of a PMIC as disclosed herein, in conjunction with any circuitry or other mechanism in an integrated circuit.

At 802, in the illustrated embodiment, a power management circuit receives a power reset signal.

At 804, in the illustrated embodiment, the power management circuit receives a binary value indicating activity of a memory circuit coupled to the power management circuit where the memory circuit includes non-volatile flash memory. In some embodiments, the binary value indicating activity of the memory circuit is received from the memory circuit. In some embodiments, the binary value indicating activity of the memory circuit is received from a memory controller circuit coupled to the memory circuit.

At 806, in the illustrated embodiment, the power management circuit determines whether to reset power to the memory circuit based on the binary value. In some embodiments, the power management circuit determines to reset power to the memory circuit when the binary value indicates the memory circuit is inactive and the power management circuit resets power for the memory circuit. In some embodiments, the power management circuit determines to inhibit resetting power to the memory circuit when the binary value indicates the memory circuit is active.

In some embodiments, the power management circuit receives an updated binary value indicating the memory circuit is inactive and the power management circuit resets power for the memory circuit. In some embodiments, the power management circuit initiates a clock timer when the binary value indicating the memory circuit is active is received and, after a predetermined period of time elapses according to the clock timer, resets power for the memory circuit.

Example Computer System

Figure 9:
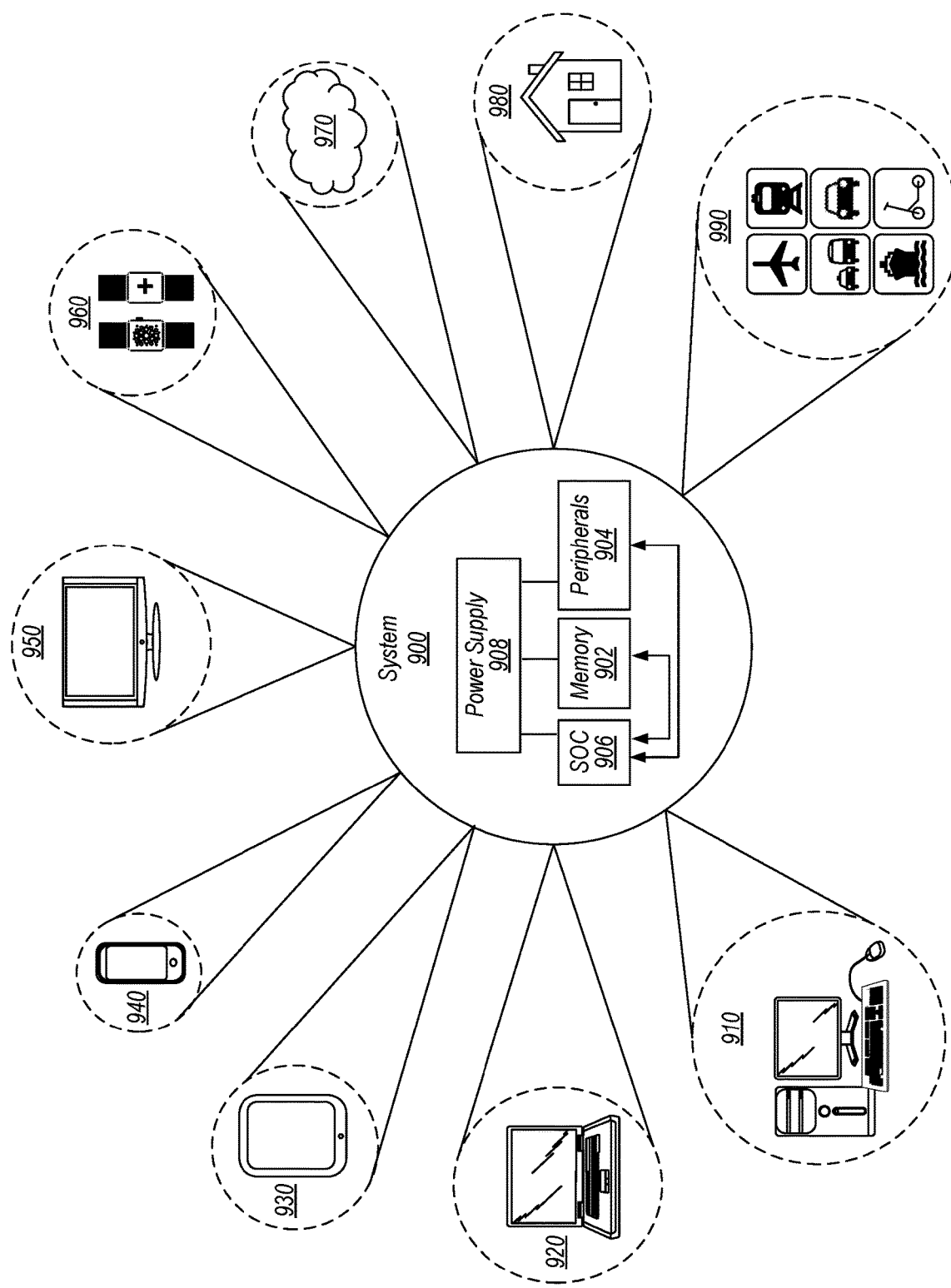
FIG. 9 is a block diagram of one embodiment of an example system.

Turning next to FIG. 9, a block diagram of one embodiment of a system 900 is shown that may incorporate and/or otherwise utilize the methods and mechanisms described herein. In the illustrated embodiment, the system 900 includes at least one instance of a system on chip (SoC) 906 which may include multiple types of processing units, such as a central processing unit (CPU), a graphics processing unit (GPU), or otherwise, a communication fabric, and interfaces to memories and input/output devices. In some embodiments, one or more processors in SoC 906 includes multiple execution lanes and an instruction issue queue. In various embodiments, SoC 906 is coupled to external memory 902, peripherals 904, and power supply 908.

A power supply 908 is also provided which supplies the supply voltages to SoC 906 as well as one or more supply voltages to the memory 902 and/or the peripherals 904. In various embodiments, power supply 908 represents a battery (e.g., a rechargeable battery in a smart phone, laptop or tablet computer, or other device). In some embodiments, more than one instance of SoC 906 is included (and more than one external memory 902 is included as well).

The memory 902 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 904 include any desired circuitry, depending on the type of system 900. For example, in one embodiment, peripherals 904 includes devices for various types of wireless communication, such as Wi-Fi, Bluetooth, cellular, global positioning system, etc. In some embodiments, the peripherals 904 also include additional storage, including RAM storage, solid state storage, or disk storage. The peripherals 904 include user interface devices such as a display screen, including touch display screens or multi-touch display screens, keyboard or other input devices, microphones, speakers, etc.

As illustrated, system 900 is shown to have application in a wide range of areas. For example, system 900 may be utilized as part of the chips, circuitry, components, etc., of a desktop computer 910, laptop computer 920, tablet computer 930, cellular or mobile phone 940, or television 950 (or set-top box coupled to a television). Also illustrated is a smartwatch and health monitoring device 960. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 900 may further be used as part of a cloud-based service(s) 970. For example, the previously mentioned devices, and/or other devices, may access computing resources in the cloud (i.e., remotely located hardware and/or software resources). Still further, system 900 may be utilized in one or more devices of a home 980 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 9 is the application of system 900 to various modes of transportation 990. For example, system 900 may be used in the control and/or entertainment systems of aircraft, trains, buses, cars for hire, private automobiles, waterborne vessels from private boats to cruise liners, scooters (for rent or owned), and so on. In various cases, system 900 may be used to provide automated guidance (e.g., self-driving vehicles), general systems control, and otherwise. These any many other embodiments are possible and are contemplated. It is noted that the devices and applications illustrated in FIG. 9 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit device, comprising:
a memory circuit comprising non-volatile flash memory;
a power rail providing power to the non-volatile flash memory; and
a power management circuit coupled to the memory circuit and the power rail, wherein the power management circuit regulates power provided from the power rail to the non-volatile flash memory, wherein the power management circuit is configured to receive a power reset signal, and wherein, in response to receiving the power reset signal at the power management circuit, the power management circuit is configured to:
receive an activity output signal from a portion of the non-volatile flash memory dedicated to output a binary value in the activity output signal corresponding to whether the portion is active or inactive;
assess the binary value in the activity output signal, the binary value indicating whether the portion is active or inactive at a time the power reset signal is received at the power management circuit;
reset the power on the power rail provided to the non-volatile flash memory when the binary value indicates the portion is inactive at the time the power reset signal is received at the power management circuit; and
inhibit resetting the power on the power rail provided to the non-volatile flash memory when the binary value indicates the portion is active at the time the power reset signal is received at the power management circuit.

2. The device of claim 1, wherein the portion of the non-volatile flash memory is active when the memory circuit is programming or erasing.

3. The device of claim 1, wherein the power management circuit is configured to reset power on the power rail provided to the non-volatile flash memory when the binary value changes to indicating the portion is inactive after the time the power reset signal is received at the power management circuit.

4. The device of claim 1, wherein the power management circuit is configured to reset power on the power rail provided to the non-volatile flash memory after a predetermined period of time elapses after the time the power reset signal is received at the power management circuit.

5. The device of claim 1, wherein the portion of the non-volatile flash memory providing the activity output signal is a bit in the non-volatile flash memory dedicated to providing the activity output signal.

6. A method comprising:
receiving, at a power management circuit regulating a power rail providing power to non-volatile flash memory in a memory circuit of an integrated circuit device, a power reset signal;
receiving, at the power management circuit, an activity output signal from a portion of the non-volatile flash memory dedicated to output a binary value in the activity output signal corresponding to whether the portion is active or inactive;
assessing, at the power management circuit, the binary value in the activity output signal, the binary value indicating whether the portion is active or inactive at a time the power reset signal is received at the power management circuit;
resetting, by the power management circuit, the power on the power rail provided to the non-volatile flash memory when the binary value indicates the portion is inactive at the time the power reset signal is received at the power management circuit; and
inhibiting resetting, by the power management circuit, the power on the power rail provided to the non-volatile flash memory when the binary value indicates the portion is active at the time the power reset signal is received at the power management circuit.

7. The method of claim 6, further comprising, while inhibiting resetting the power on the power rail provided to the non-volatile flash memory:
receiving, by the power management circuit, the activity output signal with an updated binary value indicating the portion is inactive at least some time after the power reset signal is received at the power management circuit; and
resetting, by the power management circuit, the power on the power rail provided to the non-volatile flash memory.

8. The method of claim 6, further comprising:
initiating, by the power management circuit, a clock timer when the power reset signal is received and the binary value indicates the portion is active at the time the power reset signal is received at the power management circuit; and
after a predetermined period of time elapses after the time the power reset signal is received at the power management circuit according to the clock timer, resetting, by the power management circuit, the power on the power rail provided to the non-volatile flash memory.

9. The method of claim 6, further comprising providing the activity output signal from a bit in the non-volatile flash memory dedicated to providing the activity output signal.

10. An integrated circuit device, comprising:
a plurality of memory circuits comprising non-volatile flash memory;
a power rail providing power to the memory circuit; and;
a power management circuit coupled to the plurality of memory circuits and the power rail, wherein the power management circuit regulates power provided from the power rail to the non-volatile flash memory, wherein the power management circuit is configured to receive a power reset signal, and wherein, in response to receiving the power reset signal at the power management circuit, the power management circuit is configured to:
receive an activity output signal from a portion of the non-volatile flash memory dedicated to output a binary value in the activity output signal corresponding to whether the portion is active or inactive;
assess the binary value in the activity output signal, the binary value indicating whether the portion is active or inactive at a time the power reset signal is received at the power management circuit;
reset the power on the power rail provided to the non-volatile flash memory when the binary value indicates the portion is inactive at the time the power reset signal is received at the power management circuit; and
inhibit resetting the power on the power rail provided to the non-volatile flash memory when the binary value indicates the portion is active at the time the power reset signal is received at the power management circuit.

11. The device of claim 10, wherein the power management circuit is configured to inhibit resetting the power to all memory circuits in the plurality of memory circuits when the binary value indicates the portion is active at the time the power reset signal is received at the power management circuit.

12. The device of claim 11, wherein the power management circuit is configured to assess individual binary values in activity output signals indicating activity of a plurality of portions of the non-volatile flash memory in the plurality of memory circuits, and wherein the power management circuit is configured to reset the power to all the portions of the non-volatile flash memory in the plurality of memory circuits when all the individual binary values indicate all portions are inactive.

13. The device of claim 1, wherein the power management circuit is configured to receive the power reset signal from a component separate from the memory circuit.

14. The method of claim 6, wherein the power management circuit receives the power reset signal from a component separate from the memory circuit.

15. The device of claim 5, wherein the bit is a readable bit in the non-volatile flash memory.

16. The device of claim 10, wherein the portion of the non-volatile flash memory providing the activity output is a bit in the non-volatile flash memory dedicated to providing the activity output signal.

17. The device of claim 5, wherein the binary value in the activity output signal corresponds to whether the bit is active or inactive.

18. The device of claim 1, wherein the power management circuit is configured to receive the power reset signal from a source operating independently of the power rail.

19. The device of claim 1, wherein the power management circuit is configured to control power provided from the power rail to the non-volatile flash memory independent of other components of the integrated circuit.

20. The device of claim 11, wherein the power management circuit is configured to assess individual binary values in activity output signals indicating activity of a plurality of portions of the non-volatile flash memory in the plurality of memory circuits, and wherein the power management circuit is configured to inhibit resetting the power to all the portions of the non-volatile flash memory in the plurality of memory circuits when at least one of the individual binary values indicates at least one of the portions is active.

* * * * *